US 9,306,492 B2

(12) United States Patent
Kim et al.

(10) Patent No.: US 9,306,492 B2
(45) Date of Patent: Apr. 5, 2016

(54) OSCILLATOR AND SEMICONDUCTOR DEVICE INCLUDING THE SAME

(71) Applicants: SK hynix Inc., Icheon (KR); INDUSTRY-ACADEMIC COOPERATION FOUNDATION, YONSEI UNIVERSITY, Seoul (KR)

(72) Inventors: Yeo-Myung Kim, Gyeongsangbuk-do (KR); Tae-Wook Kim, Seoul (KR); Young-Cheol Chae, Seoul (KR); Jae-Hoon Kim, Seoul (KR)

(73) Assignees: SK HYNIX INC., Icheon (KR); INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 0 days.

(21) Appl. No.: 14/631,701

(22) Filed: Feb. 25, 2015

(65) Prior Publication Data

US 2016/0006393 A1    Jan. 7, 2016

(30) Foreign Application Priority Data

Jul. 2, 2014    (KR) .................. 10-2014-0082733

(51) Int. Cl.
*H03K 3/0231* (2006.01)
*H03B 5/02* (2006.01)

(52) U.S. Cl.
CPC ............ *H03B 5/02* (2013.01); *H03K 3/0231* (2013.01)

(58) Field of Classification Search
CPC .............................. H03K 3/0231; H03K 3/03
USPC ........................................ 331/111, 143, 153
See application file for complete search history.

(56) References Cited

U.S. PATENT DOCUMENTS

| | | | | |
|---|---|---|---|---|
| 4,623,851 A * | 11/1986 | Abou | ................... | H03K 3/0231 331/111 |
| 5,670,915 A * | 9/1997 | Cooper | ................ | H03K 3/0231 331/111 |
| 6,326,859 B1 * | 12/2001 | Goldman | ............... | H03K 3/011 331/111 |
| 7,107,178 B2 * | 9/2006 | Won | ....................... | G01K 3/005 327/513 |
| 7,847,648 B2 * | 12/2010 | Hu | ......................... | H03K 3/011 331/143 |
| 8,432,174 B2 * | 4/2013 | Liu | ........................ | H03M 1/60 324/691 |
| 2013/0038364 A1 * | 2/2013 | Tokairin | ................ | H03K 4/502 327/156 |

FOREIGN PATENT DOCUMENTS

KR    10-1999-0076264 A    10/1999

OTHER PUBLICATIONS

Kunil Choe et al., "A Precision Relaxation Oscillator with a Self-Clocked Offset-Cancellation Scheme for Inplantable Biomedical SoCs", IEEE International Solid-State Circuits Conference, Feb. 11, 2009, pp. 402-403, and 403a, IEEE.
Kamran Souri et al., "A Precision DTMOST-based Temperature Sensor", 2011, pp. 279-282, IEEE.

* cited by examiner

Primary Examiner — Levi Gannon

(57) ABSTRACT

An oscillator includes a flip-flop that outputs a first signal having a phase that is inverted according to a comparison signal, a comparison circuit that compares an amplification voltage with a first reference voltage and outputs the comparison signal, a current source having an output voltage that is fixed to a second reference voltage, and an amplification circuit that generates the amplification voltage according to a current outputted from the current source and the second reference voltage.

15 Claims, 12 Drawing Sheets

<PRIOR ART>

OSCILLATOR AND SEMICONDUCTOR DEVICE INCLUDING THE SAME

The present application claims priority under 35 U.S.C. §119(a) to Korean application number 10-2014-0082733, filed on Jul. 2, 2014, in the Korean Intellectual Property Office, which is incorporated herein by reference in its entirety as set forth in full.

BACKGROUND

1. Technical Field

Embodiments of the present disclosure relate to an oscillator less affected by process variation and a semiconductor device including the same.

2. Related Art

FIG. 1 is a circuit diagram illustrating a conventional oscillator 101.

The illustrated oscillator 101 is a relaxation oscillator and includes a current source CS, a capacitor C, a comparator CMP, a delay circuit D, an inverter INV, and a PMOS transistor P.

When a value of an output of the comparator CMP is at a high level, because a value of an output of the inverter INV is at a low level, the PMOS transistor P is turned on, so that the capacitor C is charged towards a power supply voltage VDD.

When the charged voltage of the capacitor C becomes equal to or greater than a reference voltage $V_{REF}$, the value of the output of the comparator CMP becomes a low level. The change in the output of the comparator CMP is delayed by the delay circuit D, and then the output of the inverter INV becomes a high level, at which time the PMOS transistor P is turned off. At this time, the charge charged in the capacitor C is discharged through the current source CS, so that the voltage of the capacitor C is lowered.

When the voltage of the capacitor C falls below the reference voltage $V_{REF}$, the value of the output of the comparator CMP becomes the high level, and the aforementioned operation is repeated. Accordingly, an output signal Vout of the oscillator 101 becomes a pulse type signal having a cycle time corresponding to the magnitude of the reference voltage $V_{REF}$ and the magnitude of a current of the current source CS.

The current source CS included in the conventional oscillator 101 may, for example, have a structure in which diodes are serially connected to one another. Since such a current source has a characteristic that the size of a current changes according to temperature, the cycle time of the output signal Vout of the oscillator 101 also changes according to the temperature.

FIG. 2 is a graph of a difference according to temperature of signals outputted from the oscillator 101 of FIG. 1.

FIG. 2(a) illustrates a signal at 25° C. for example and FIG. 2(b) illustrates a signal at 90° C. for example.

In the conventional oscillator 101 as described above, since the cycle time of the output signal Vout changes according to temperature, the value of the reference voltage $V_{REF}$ is adjusted such that a constant cycle time can be obtained at a specific temperature, such as 90° C. for example.

However, when process variation occurs, since the size of a current outputted from the current source CS changes according to the process variation, an output signal Vout having an expected cycle time may not be obtained.

FIG. 3 is a graph for explaining the problems of the conventional oscillator.

A line with round markers indicates the case in which process variation is positioned at a Fast-Fast (FF) corner, a line with square markers indicates the case in which the process variation is positioned at a Nominal-Nominal (NN) corner, and a line with triangular markers indicates the case in which the process variation is positioned at a Slow-Slow (SS) corner. As illustrated in FIG. 3, in the conventional oscillator 101, when a temperature is lower than reference temperature (in the example shown in FIG. 3, 90° C.), an increase in a difference among a period (that is, a cycle time) of cycles of the output signal Vout according to the process variation occurs.

When the period of cycles of the output signal Vout of the oscillator 101 changes according to the process variation, as described above, a semiconductor device including the oscillator 101 may operate abnormally. For example, under the assumption that the oscillator 101 controls a self-refresh cycle of a semiconductor memory device, if a signal having a cycle time longer than a preferable refresh cycle is outputted, data may be lost in some cases. In another case, if a signal having a cycle time shorter than the preferable refresh cycle is outputted, then the number of times a refresh is performed may unnecessarily increase, resulting in performance deterioration and power waste of the semiconductor device.

SUMMARY

Embodiments of the present disclosure are directed to an oscillator less affected by process variation and a semiconductor device including the same.

In an embodiment of the present disclosure, an oscillator includes: a flip-flop that outputs a first signal having a phase that is inverted according to a comparison signal; a comparison circuit that compares an amplification voltage with a first reference voltage and outputs the comparison signal; a current source having an output voltage that is fixed to a second reference voltage; and an amplification circuit that generates the amplification voltage according to a current outputted from the current source and the second reference voltage.

In an embodiment, a semiconductor device includes: a semiconductor device includes: an oscillator that outputs an oscillation signal; a memory cell array; and a self-refresh controller that controls a self-refresh operation of the memory cell array according to the oscillation signal, wherein the oscillator includes: a flip-flop that outputs the oscillation signal having a phase that is inverted according to a comparison signal; a comparison circuit that compares an amplification voltage with a first reference voltage and outputs the comparison signal; a current source having an output voltage that is fixed to a second reference voltage; and an amplification circuit that generates the amplification voltage according to a current outputted from the current source and the second reference voltage.

The oscillator according to the present disclosure can reduce the influence of process variation and maintain the cycle time of an output signal more constantly, so that an abnormal operation of a semiconductor device including the oscillator according to the present technology can be reduced. For example, when the oscillator according to the present disclosure is used in order to control a self-refresh operation of a semiconductor device such as a DRAM, data loss of a cell, which may occur by variation of a cycle time due to process variation, is substantially prevented, so that the reliability of the DRAM can be improved, and the semiconductor device can be designed such that a refresh cycle is not unnecessarily short, so that the performance deterioration and power waste of the semiconductor device can be substantially prevented.

BRIEF DESCRIPTION OF THE DRAWINGS

Features, aspects, and embodiments are described in conjunction with the attached drawings, in which.

DETAILED DESCRIPTION

Hereinafter, an oscillator and a semiconductor device including the same according to the present disclosure will be described in detail with reference to the accompanying drawings through illustrative embodiments.

Figure 4:
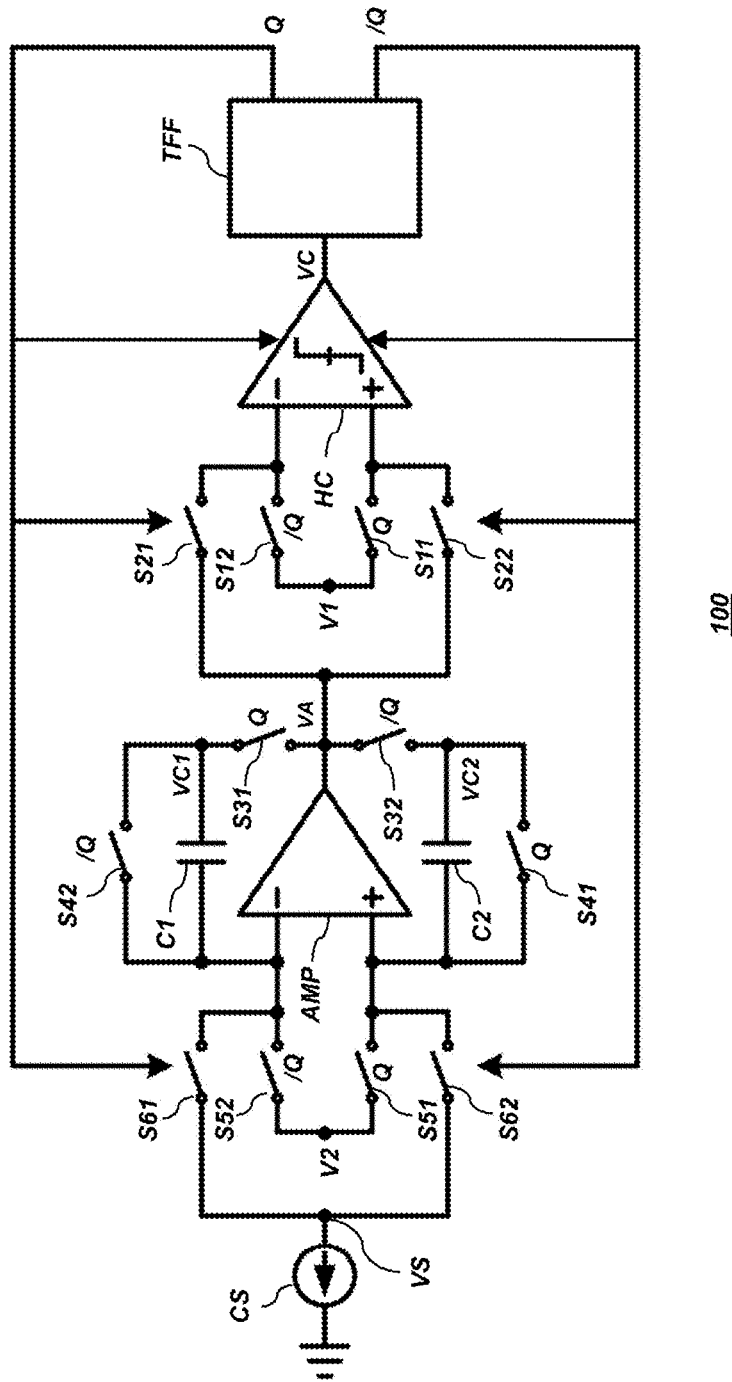
FIG. 4 is a circuit diagram illustrating an oscillator according to an embodiment of the present disclosure.

FIG. 4 is a circuit diagram illustrating an oscillator 100 according to an embodiment of the present disclosure.

The oscillator 100 according to an embodiment of the present disclosure includes a current source CS, an amplification circuit AMP, a comparison circuit HC, and a flip-flop TFF.

The flip-flop TFF is a toggle type flip-flop, and outputs a first signal Q, which has a phase that is inverted at a positive edge of a comparison signal VC outputted from the comparison circuit HC, and a second signal /Q having a phase opposite to that of the first signal Q.

The comparison circuit HC compares two input signals with each other and outputs a high level or low level comparison signal VC according to the comparison result.

In the present embodiment, the comparison circuit HC operates in a chopping scheme such that the input signals are internally reversed according to the first signal Q and the second signal /Q. That is, in an embodiment, when the first signal Q is high and the second signal /Q is low, a value of the comparison signal VC of the comparison circuit HC is high when a voltage on a positive input (+) of the comparison circuit HC is greater than a voltage on a negative input (−) of the comparison circuit HC and the value of the comparison signal VC is low otherwise. On the other hand, when the first signal Q is low and the second signal /Q is high, the value of the comparison signal VC is low when a voltage on the positive input is greater than a voltage on the negative input and the value of the comparison signal VC is high otherwise.

In FIG. 4, the oscillator 400 further includes first and second comparator input switches S11 and S12, which are controlled according to the first signal Q and the second signal /Q respectively and selectively provide a first reference voltage V1 to input terminals of the comparison circuit HC, and third and fourth comparator input switches S21 and S22 that are controlled according to the first signal Q and the second signal /Q respectively and selectively connect an output terminal of the amplification circuit AMP to the input terminals of the comparison circuit HC. The first, second, third, and fourth comparator input switches S11, S12, S21, and S22 operate to switch the sources of the positive and negative inputs of the comparison circuit HC in order to compensate for the chopping scheme of the comparison circuit HC.

For example, when the first signal Q is at a high level, the first through fourth comparator input switches S11, S12, S21, and S21 operate to route the first reference voltage V1 to the positive input of the comparison circuit HC and an amplification voltage VA outputted from the amplification circuit AMP to the negative input of the comparison circuit HC. Therefore, when the first reference voltage V1 is larger than the amplification voltage VA, the comparison circuit HC outputs a high level as a value of the comparison signal VC, and when the first reference voltage V1 is smaller than the amplification voltage VA, the comparison circuit HC outputs a low level as the value of the comparison signal VC.

Furthermore, when the first signal Q is at a low level, the first through fourth comparator input switches S11, S12, S21, and S21 operate to route the first reference voltage V1 to the negative input of the comparison circuit HC and amplification voltage VA to the positive input of the comparison circuit HC. Therefore, because the positive and negative input signals are internally reversed within the comparison circuit HC, when the first reference voltage V1 is larger than the amplification voltage VA, the comparison circuit HC outputs the low level as the value of the comparison signal VC, and when the first reference voltage V1 is smaller than the amplification voltage VA, the comparison circuit HC outputs the high level as the value of the comparison signal VC. That is, regardless of the level of the first signal Q, the comparison circuit HC outputs the high level as the value of the comparison signal VC when the first reference voltage V1 is smaller than the amplification voltage VA, and outputs the low level as the value of the comparison signal VC when the first reference voltage V1 is larger than the amplification voltage VA.

Figure 5:
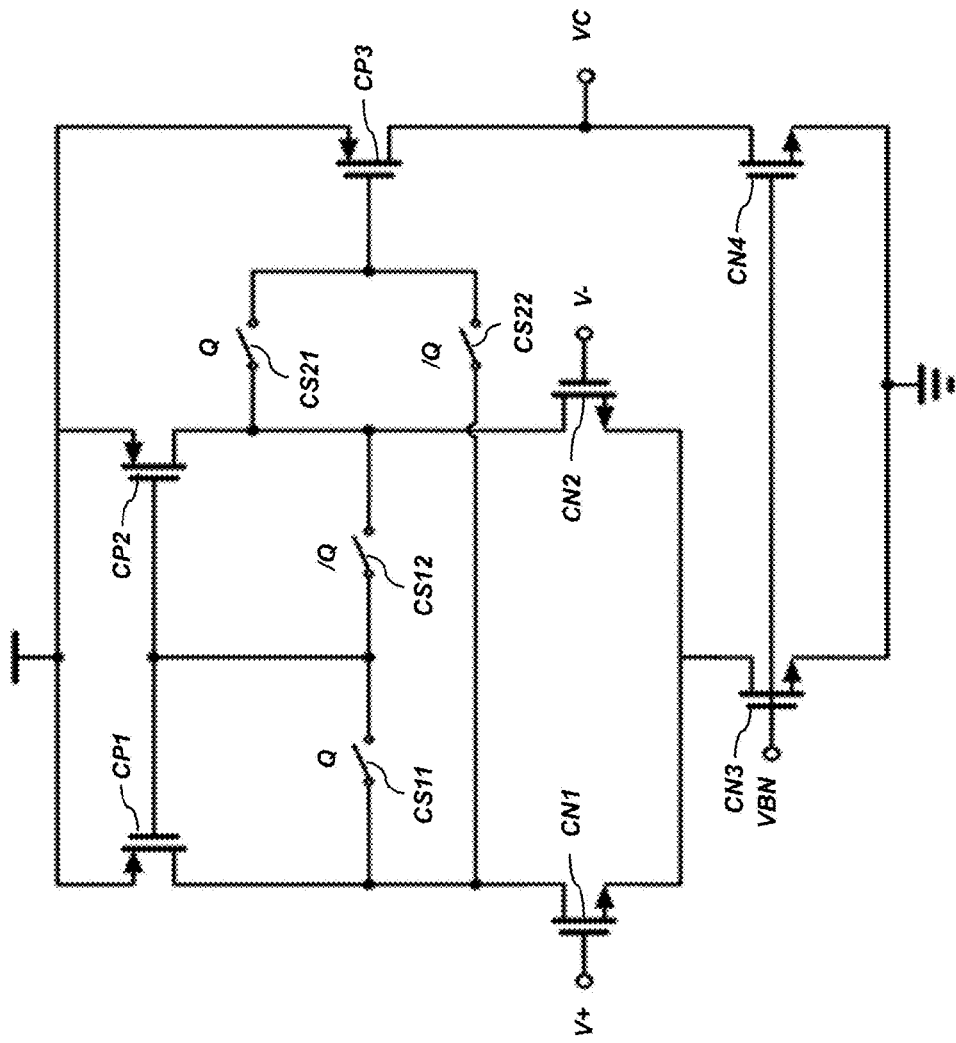
FIG. 5 is a circuit diagram of a comparison circuit of FIG. 4 according to an embodiment.

FIG. 5 is a circuit diagram illustrating the comparison circuit HC of FIG. 4 according to an embodiment.

The comparison circuit HC includes first through third PMOS transistors CP1 through CP3 and first through fourth NMOS transistors CN1 through CN4, and compares plus and minus input voltages V+ and V− with each other and outputs the comparison signal VC. The plus input voltage V+ is applied to a gate of the first NMOS transistor CN1 and the minus input voltage V− is applied to a gate of the second NMOS transistor CN2. A first bias voltage VBN is inputted to the third and fourth NMOS transistors CN3 and CN4.

The comparison circuit HC includes first through fourth switches CS11, CS12, CS21, and CS22 which internally reverse the comparison result of the input voltages V+ and V− according to the first signal Q and the second signal /Q. That is, when the first signal Q has a high value, the first switch CS11 connects a drain of the first NMOS transistor CN1 to gates of the first and second PMOS transistors CP1 and CP1 and the third switch CS21 connects a drain of the second NMOS transistor CN2 to a gate of the third PMOS transistor CP3. When the second signal /Q has a high value, the second switch CS12 connects the drain of the second NMOS transistor CN2 to the gates of the first and second PMOS transistors CP1 and CP1 and the fourth switch CS22 connects the drain of the first NMOS transistor CN1 to the gate of the third PMOS transistor CP3. The comparison circuit HC outputs the comparison signal VC through a connection node of drains of the third PMOS transistor CP3 and the fourth NMOS transistor CN4.

In FIG. 4, the amplification circuit AMP amplifies a voltage difference of positive (+) and negative (−) input signals of the amplification circuit AMP to output the amplification voltage VA.

In the present embodiment, the amplification circuit AMP operates in a chopping scheme such that the input signals are internally reversed according to the first signal Q and the second signal /Q. Therefore, the oscillator 400 includes first and second amplifier input switches S51 and S52, which are controlled according to the first signal Q and the second signal /Q and provide a second reference voltage V2 lower than the first reference voltage V1 to the input terminals of the amplification circuit AMP, and third and fourth amplifier input switches S61 and S62 that are controlled according to the first signal Q and the second signal /Q respectively and connect the input terminals of the amplification circuit AMP to the current source CS. The first, second, third, and fourth amplifier input switches S51, S52, S61, and S62 operate to route a voltage VS of the current source CS to the negative input terminal of the amplification circuit AMP and the second reference voltage V2 to the positive input terminal of the amplification circuit AMP when the first signal Q is at a high level and the second signal /Q is at a low level, and operate to route the voltage VS to the positive input terminal and the second reference voltage V2 to the negative input terminal when the first signal Q is at a low level and the second signal /Q is at a high level. As a result, when the first signal Q is at a high level and the second signal /Q is therefore at a low level, the amplification circuit AMP amplifies a value obtained by subtracting the voltage VS of the current source CS from the second reference voltage V2, and outputs the amplified value. When the first signal Q is at a low level and the second signal /Q is therefore at a high level, the input signals are internally reversed, and the amplification circuit AMP amplifies a value obtained by subtracting the voltage VS of the current source CS from the second reference voltage V2, and outputs the amplified value.

That is, regardless of the value of the first signal Q, the amplification circuit AMP amplifies the value obtained by subtracting the voltage VS of the current source CS from the second reference voltage V2, and outputs the amplification voltage VA.

Figure 6:
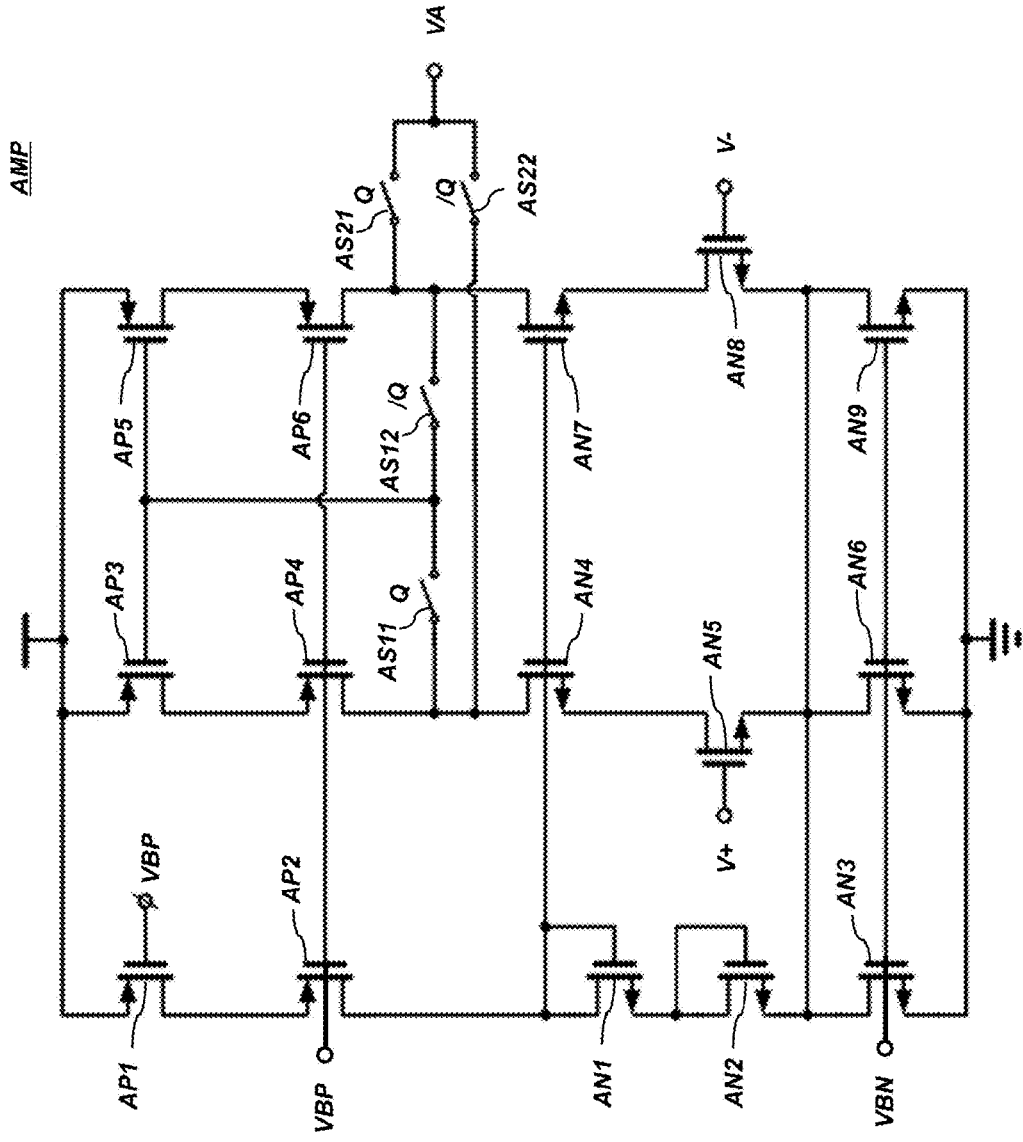
FIG. 6 is circuit diagram of an amplification circuit of FIG. 4 according to an embodiment.

FIG. 6 is circuit diagram illustrating the amplification circuit AMP of FIG. 4 according to an embodiment.

The amplification circuit AMP includes first through sixth PMOS transistors AP1 through AP6 and first through ninth NMOS transistors AN1 through AN9, and compares the input voltages V+ and V− with each other and outputs the amplification voltage VA. The fifth and eighth NMOS transistors AN5 and AN8 operate as a differential pair and receive the positive and negative input voltages V+ and V−, respectively. A second bias voltage VBP is inputted to the first, second, fourth and sixth PMOS transistors AP1, AP2, AP4 and AP6 and the first bias voltage VBN is inputted to the third, sixth, and ninth NMOS transistors AN3, AN6, and AN9. The amplification circuit AMP includes switches AS11, AS12, AS21, and AS22 that operate to internally reverses the positive and negative input voltages V+ and V− according to the first signal Q and the second signal /Q. The amplification circuit AMP outputs the amplification voltage VA.

In FIG. 4, in the current source CS, even though the magnitude of a current of the current source CS changes according to temperature, it is preferable that the range of variation of the current due to process variation is minimized.

Figure 7:
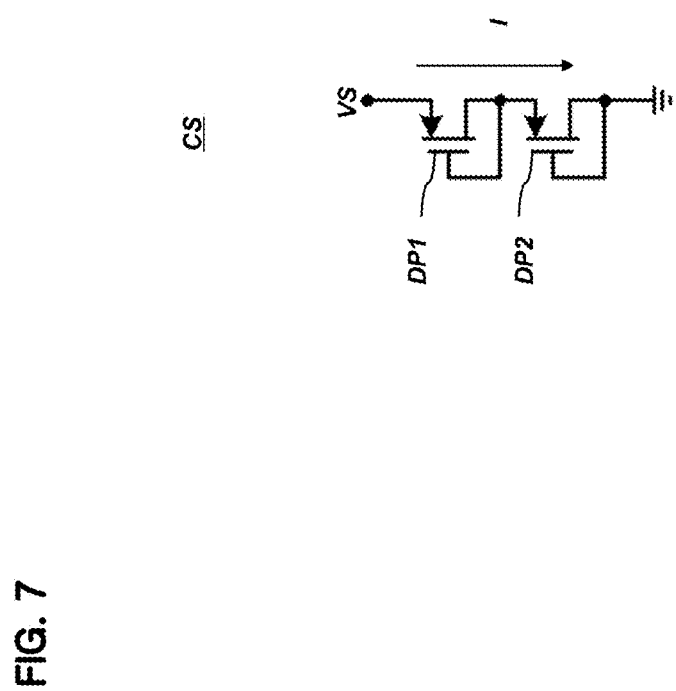
FIG. 7 is a circuit diagram of a current source of FIG. 4 according to an embodiment.

FIG. 7 is a circuit diagram illustrating the current source CS of FIG. 4 according to an embodiment of the present disclosure.

The current source CS includes first and second diode-connected PMOS transistors DP1 and DP2. A current I flowing through the current source CS is expressed by Equation 1 below.

$$I = K_1 \cdot \exp[K_2(VS - V_{TH})] \quad \text{(Equation 1)}$$

In Equation 1 above, $K_1$ and $K_2$ are constants, VS is an output voltage of the current source CS, and $V_{TH}$ is a threshold voltage of the first and second diode-connected PMOS transistors DP1 and DP2, and exp[x] is the exponential function $e^x$. In Equation 1 above, a variable affected by process variation is the threshold voltage $V_{TH}$.

As described above, the output voltage VS of the current source CS is fixed to the second reference voltage V2; that is, the output voltage VS of the current source CS is held at a value substantially equal to the second reference voltage V2 by the operation of the amplification circuit AMP. In an embodiment, the degree of process variation is measured based on reference temperature (for example, 90° C.) and a value of the second reference voltage V2 is adjusted, so that the value of the current I can be controlled to be substantially equal to that in a general state (that is, a Nominal-Nominal (NN) corner of the process) even when the process variation deviates from the general state and reaches a Fast-Fast (FF) corner or a Slow-Slow (SS) corner of the process.

Figure 8:
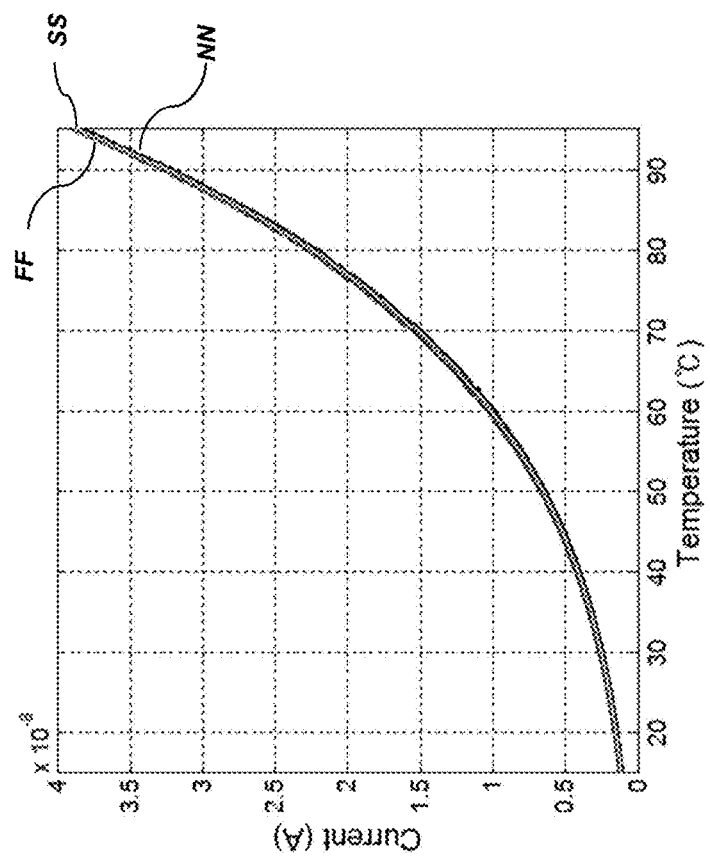
FIG. 8 is a graph illustrating a current of a current source of FIG. 7.

FIG. 8 is a graph illustrating the size of the current I outputted from the current source CS with respect to temperature and process variation in an embodiment.

In the graph, an upper dark line FF indicates the case in which the process variation is positioned at a FF corner, a lower dark line NN indicates the case in which the process variation is positioned at a NN corner, and a middle gray line SS indicates the case in which the process variation is positioned at a SS corner. As described above, the second reference voltage V2 is trimmed at the reference temperature according to the process variation, so that the size of the current I is rarely affected by the process variation at any other temperature, as is shown in FIG. 8.

Referring back to FIG. 4, the oscillator 400 further includes first and second feedback switches S31 and S32, which are controlled according to the first signal Q and the second signal /Q, respectively, and are connected to the output terminal of the amplification circuit AMP. First and second capacitors C1 and C2 are connected between negative and positive input terminals of the amplification circuit AMP and the first and second feedback switches S31 and S32, respectively. First and second discharge switches S41 and S42 are controlled according to the first signal Q and the second signal /Q, respectively, and connect both ends of the second and first capacitors C2 and C1, respectively.

The switches S11, S21, S31, S41, S51, and S61 are turned on when the first signal Q is activated, that is, when the first signal Q has a high value, and the switches S12, S22, S32, S42, S52, and S62 are turned on when the second signal /Q is activated. Hereinafter, the switches controlled by the first signal Q will be referred to as a first switch group (S11, S21, S31, S41, S51, and S61), and the switches controlled by the second signal /Q will be referred to as a second switch group (S12, S22, S32, S42, S52, and S62).

Figure 9:
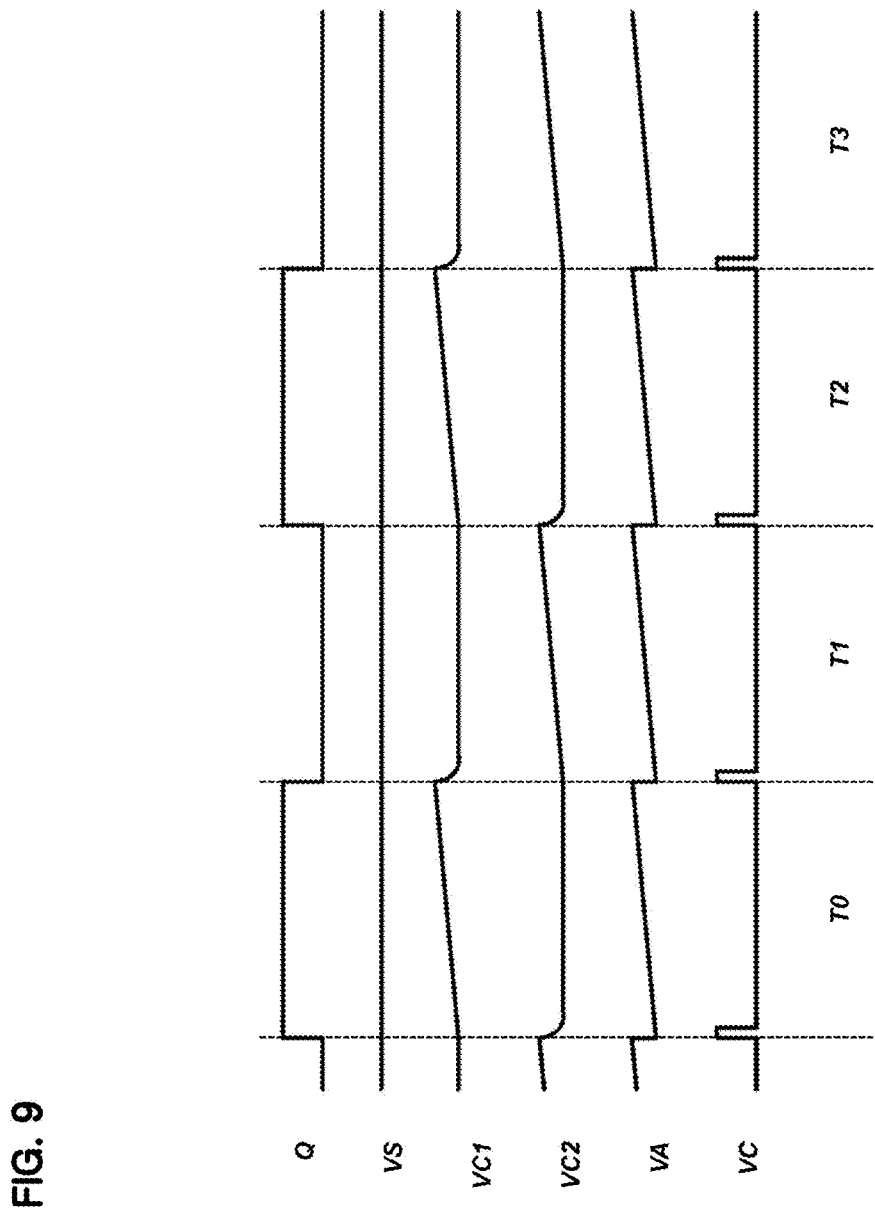
FIG. 9 is a timing diagram illustrating the operation of the oscillator of FIG. 4.

FIG. 9 is a timing diagram illustrating the operation of the oscillator of FIG. 4.

An operation in a section T0, in which the first signal Q is at a high level, will be described.

When the first signal Q is at a high level, the first switch group is turned on and the second switch group is turned off.

Since the two input terminals of the amplification circuit AMP are a virtual ground and two voltages thereon are therefore equal to each other, the output voltage VS of the current source CS is equal to the second reference voltage V2.

Previously to the section T0, when the first signal Q was at a low level, both ends of the first capacitor C1 were short-circuited by the second discharge switch S42 and the first capacitor C1 reaches a state in which it is not charged. In the section T0, the first signal Q is turned on and a first capacitor voltage VC1 is initialized to the second reference voltage V2, and the amplification voltage VA which had previously been the second capacitor voltage VC2 becomes instead the first capacitor voltage VC1.

Then, the first capacitor C1 starts to be charged by the current source CS, so that the first capacitor voltage VC1 starts to gradually rise.

Furthermore, both ends of the second capacitor C2 are connected to each other by the first discharge switch S41 and the second capacitor C2 therefore starts to be discharged, so that the second capacitor voltage VC2 starts to gradually decrease from an initial value.

Since the comparison signal VC is at a high level when the first reference voltage V1 is smaller than the amplification voltage VA outputted from the amplification circuit AMP, and is at a low level when the first reference voltage V1 is larger than the amplification voltage VA, the comparison signal VC is set to a high level shortly after the beginning of the section T0.

Then, as the first capacitor C1 is continuously charged, the first capacitor voltage VC1 exceeds the first reference voltage V1 at a certain time point.

At the corresponding time point, the comparison signal VC is transitioned to a high level, triggering the flip-flop circuit TFF so that the phases of the first signal Q and the second signal /Q, which are outputs of the flip-flop TFF, are reversed so that the first signal Q is at a low level and the second signal /Q is at a high level.

An operation in a following section T1, in which the first signal Q is at a low level, that is, the second signal /Q is at a high level, will be described.

When the second signal /Q is at a high level, the second switch group is turned on and the first switch group is turned off.

Since the two input terminals of the amplification circuit AMP are a virtual ground and two voltages thereon are therefore equal to each other, the output voltage VS of the current source CS is equal to the second reference voltage V2.

Previously in the section T0, when second signal /Q was at a low level, both ends of the second capacitor C2 are short-circuited by the first discharge switch S41 and the second capacitor C2 reaches a state in which it is not charged. In the section T1, the second signal /Q is at a high level and the second capacitor voltage VC2 is initialized to the second reference voltage V2, and the amplification voltage VA which had previously been the first capacitor voltage VC1 becomes instead the second capacitor voltage VC2.

Then, the second capacitor C2 starts to be charged by the current source CS, so that the second capacitor voltage VC2 starts to gradually rise.

Furthermore, both ends of the first capacitor C1 are connected to each other by the second discharge switch S42 and the first capacitor C1 therefore starts to be discharged, so that the first capacitor voltage VC1 starts to gradually decrease.

As described above, since the comparison signal VC is at a high level when the first reference voltage V1 is smaller than the amplification voltage VA outputted from the amplification circuit AMP, and is at a low level when the first reference voltage V1 is larger than the amplification voltage VA, the comparison signal VC is set to a high level shortly after the beginning of the section T1.

Then, as the second capacitor C2 is continuously charged, the second capacitor voltage VC2 exceeds the first reference voltage V1 at a certain time point.

At the corresponding time point, the comparison signal VC is transitioned to a high level, triggering the flip-flop circuit TFF so that the phases of the first signal Q and the second signal /Q, which are outputs of the flip-flop TFF, are reversed.

In subsequent sections T2 and T3, the aforementioned operations of sections T0 and T1, respectively are repeated.

The cycle time T of the first signal Q outputted from the oscillator of FIG. 4 may be expressed by Equation 2 below.

$$T = 2 \cdot C \cdot \frac{V1 - V2}{I} \quad \text{(Equation 2)}$$

In Equation 2 above, C denotes the capacitance of the first capacitor C1 and the second capacitor C2, and I denotes the current outputted from the current source CS.

As described above, in the present embodiment, the oscillator is designed such that the current I of the current source CS is not affected by the process variation by adjusting the value of the second reference voltage V2 in consideration of the process variation at the reference temperature (for example, 90° C.).

Consequently, since the current I and the value of the second reference voltage V2 are fixed at the reference temperature, the value of the first reference voltage V1 is adjusted in order to obtain a desired cycle time T.

As described below, the first reference voltage V1 and the second reference voltage V2 may be generated by resistance division. Because a resistor is rarely affected by process variation, the influence of a process variation on the cycle time T of Equation 2 can be minimized at any specific temperature.

As another embodiment, it may be possible to use a process for adjusting the difference between the first reference voltage V1 and the second reference voltage V2 until a cycle time T1 at the reference temperature is substantially equal to a cycle time T2 of an actually manufactured oscillator, which has been measured at the reference temperature, when the process variation is positioned in the general state (the NN corner), in order to substantially remove the influence of the process variation.

Figure 10:
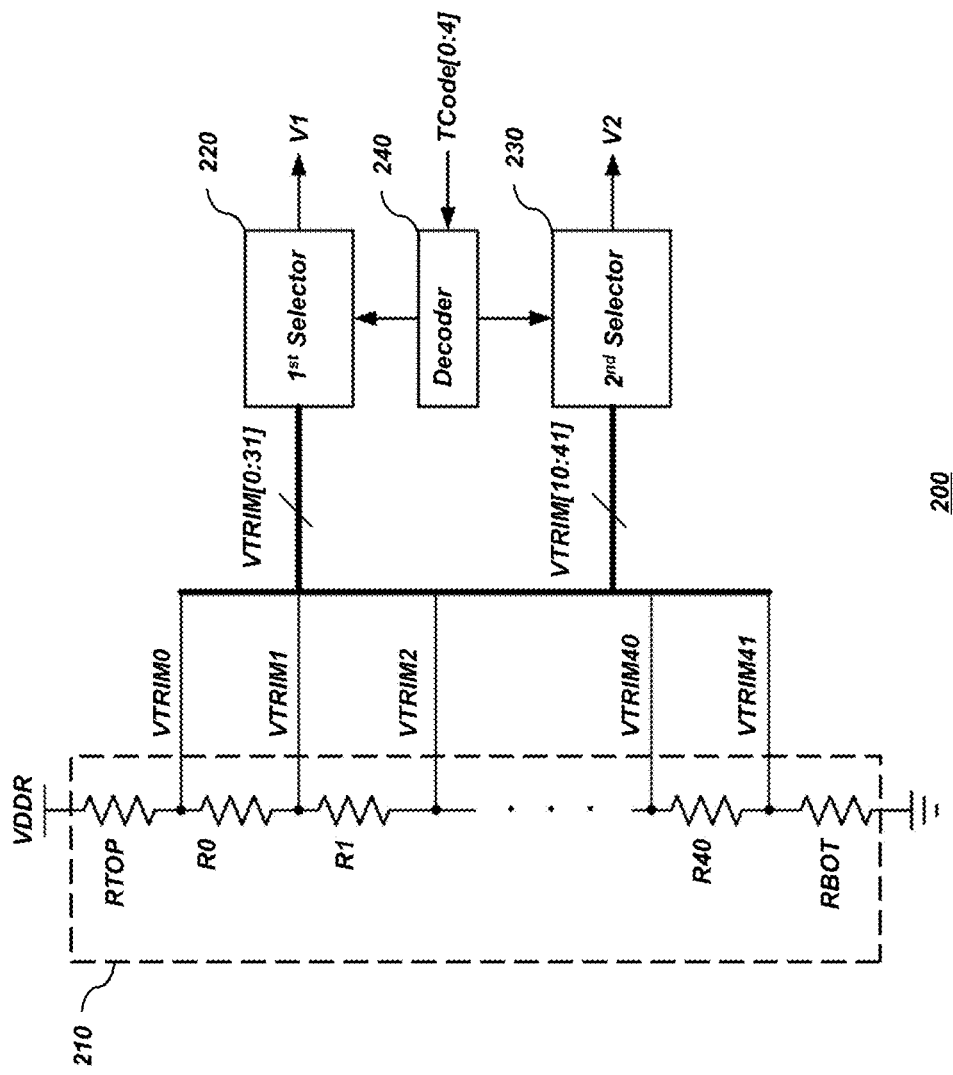
FIG. 10 is a circuit diagram illustrating a reference voltage generation circuit according to an embodiment.

FIG. 10 is a circuit diagram illustrating a reference voltage generation circuit 200 that generates the first reference voltage V1 and the second reference voltage V2.

The reference voltage generation circuit 200 includes a resistance division section 210, a first selector 220, a second selector 230, and a decoder 240. The resistance division section 210 includes a plurality of resistors RT0P, R0, R1, . . . , R40, and RB0T connected in series between a power terminal and a ground terminal. The first selector 220 selects one of a plurality of trimming voltages VTRIM[0:31] resistance-divided by the plurality of resistors RT0P, R0, R1, . . . , R40, and RB0T as the first reference voltage V1 for output. The second selector 230 selects one of a plurality of trimming voltages VTRIM[10:41] resistance-divided by the plurality of resistors RT0P, R0, R1, . . . , R40, and RB0T as the second reference voltage V2 for output. The decoder 240 generates a selection signal that is provided to the first selector 220 and the second selector 230 according to a trimming code TCode. The first reference voltage V1 is set to be higher than the second reference voltage V2.

In the reference voltage generation circuit 200 of FIG. 10, the first reference voltage V1 and the second reference voltage V2 are simultaneously decided by the same trimming code TCode. For example, the first selector 220 may select a first trimming voltage VTRIM0 when the trimming code TCode has a value of zero, a second trimming voltage VTRIM1 when the trimming code TCode has a value of one, and so on, and the second selector 230 may select an eleventh trimming voltage VTRIM10 when the trimming code TCode has a value of zero, a twelfth trimming voltage VTRIM11 when the trimming code TCode has a value of one, and so on. In another embodiment, first and second trimming codes which are independent of each other may be used for the first and second selectors 220 and 230, respectively.

Figure 11:
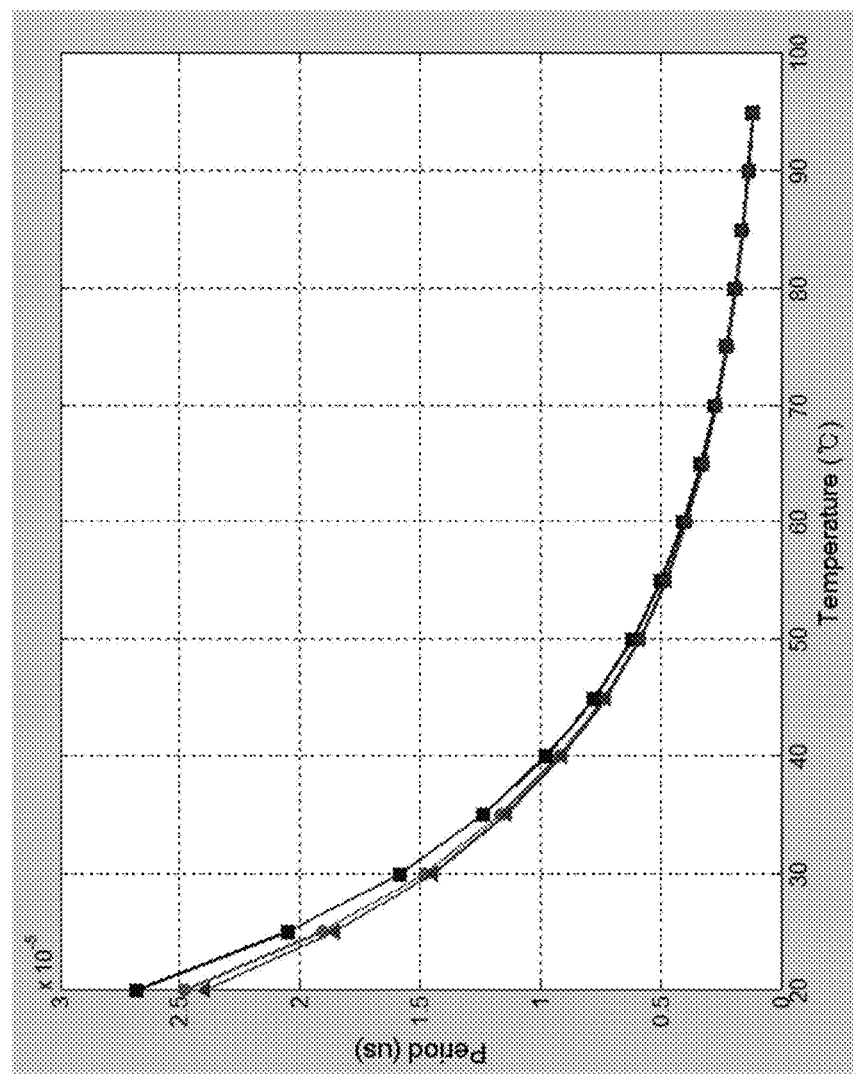
FIG. 11 is a graph illustrating an effect of process variation in an oscillator according to an embodiment.

FIG. 11 is a graph illustrating cycle times (that is, periods) of signals outputted from the oscillator of FIG. 4 according to temperature and process variation. A line with round markers indicates the case in which process variation is positioned at a Nominal-Nominal (NN) corner, a line with square markers indicates the case in which the process variation is positioned at a Slow-Slow (SS) corner, and a line with triangular markers indicates the case in which the process variation is positioned at a Fast-Fast (FF) corner. When FIG. 11 is compared with FIG. 3, it can be understood that the range of variation of a cycle time due to process variation has been considerably reduced at temperatures (for example, 30° C.) lower than the reference temperature (for example, 90° C.).

Figure 1:
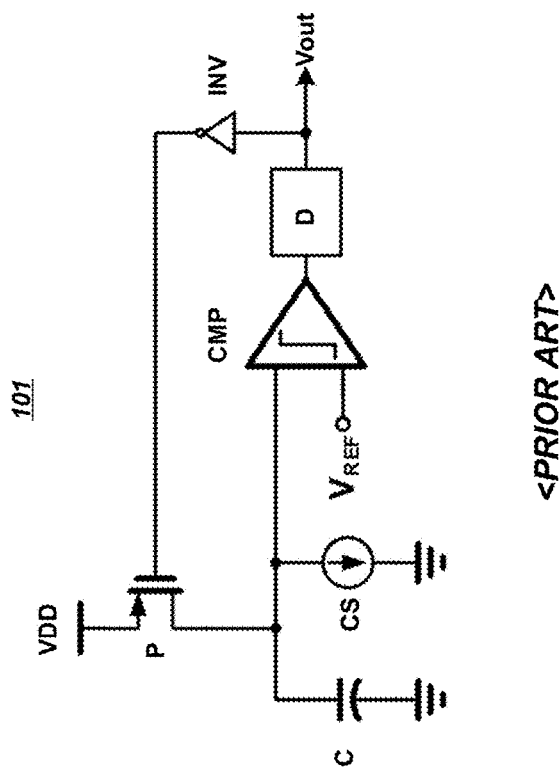
FIG. 1 is a circuit diagram illustrating a conventional oscillator.
Figure 2:
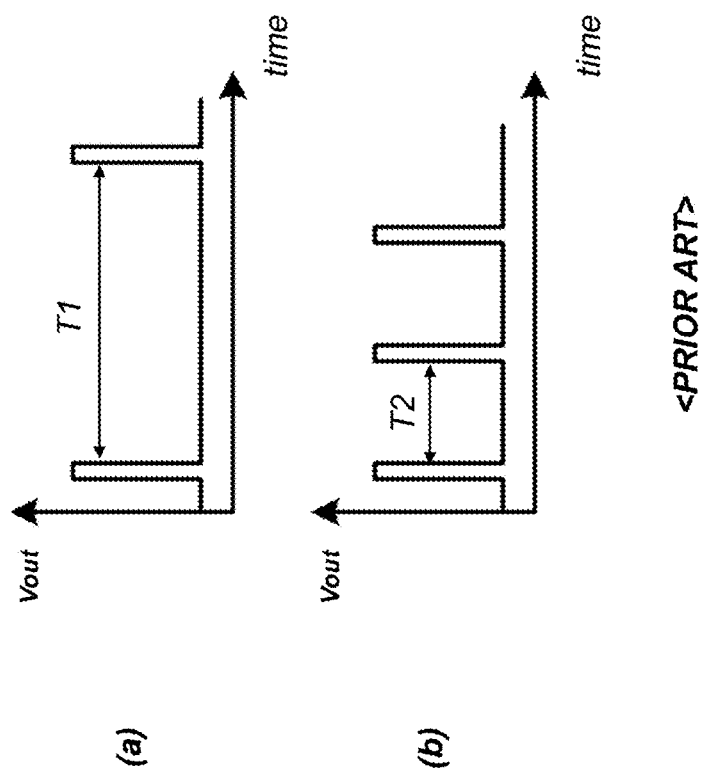
FIG. 2 is a graph illustrating a cycle time difference according to temperature of output signals from a conventional oscillator.
Figure 3:
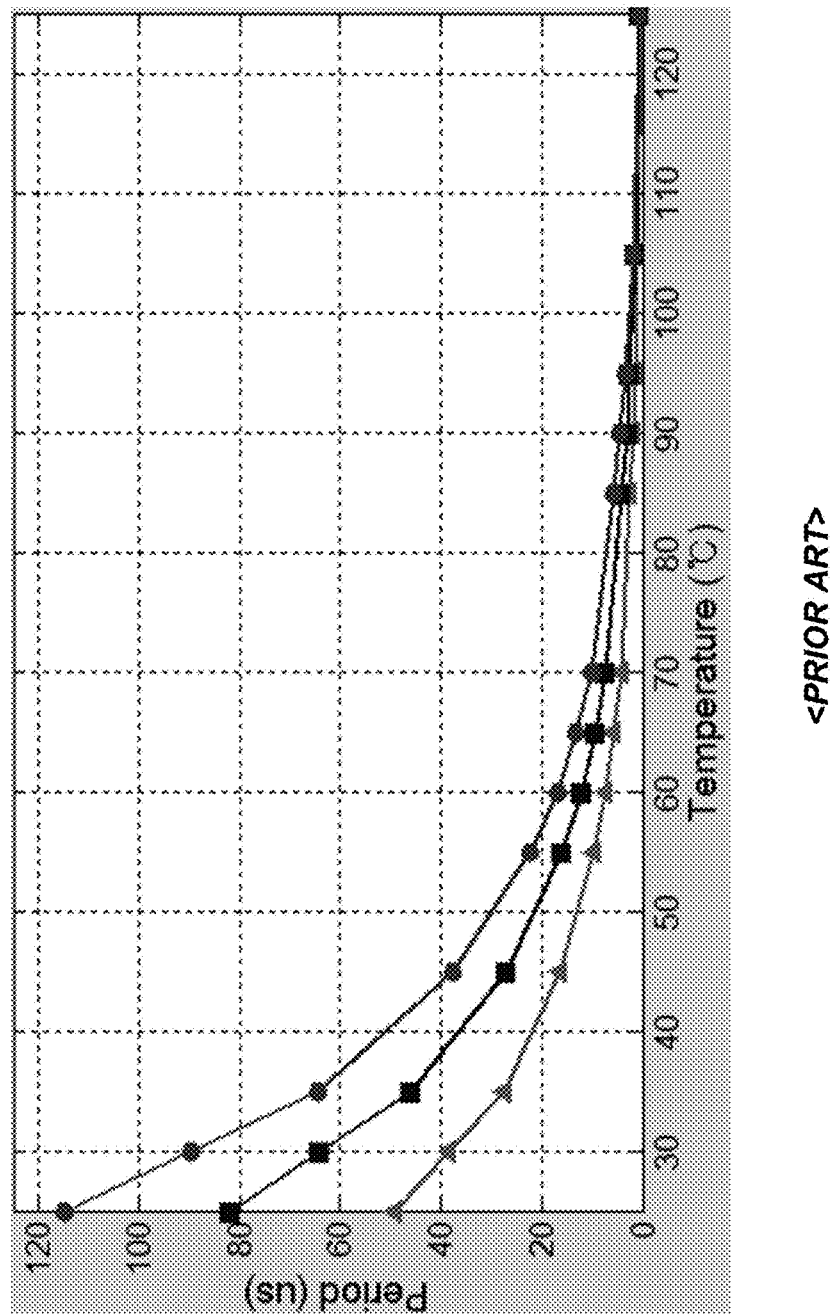
FIG. 3 is a graph illustrating the influence of process variation in a conventional oscillator.

For example, the range of variation due to the process variation at 30° C. is about 50 µs in FIG. 3, but is about 2 µs in FIG. 11.

Figure 12:
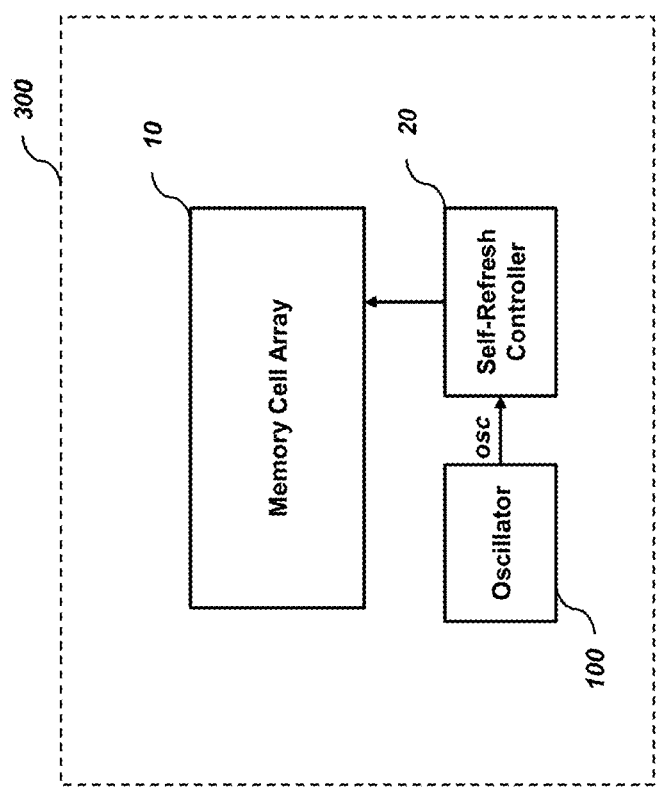
FIG. 12 is a block diagram of a semiconductor device including an oscillator according to an embodiment.

FIG. 12 is a block diagram of a semiconductor device 300 including an oscillator 100 according to an embodiment.

The semiconductor device 300 according to an embodiment of the present disclosure includes the oscillator 100, a memory cell array 10, and a self-refresh controller 20.

The oscillator 100 outputs an oscillation signal osc, wherein the range of variation of a cycle time of the oscillation signal osc due to process variation has been considerably reduced as described above.

The memory cell array 10 requires refresh, such as a DRAM memory cell array.

The self-refresh controller 20 controls the refresh operation of the memory cell array 10 by itself according to the oscillation signal osc outputted from the oscillator 100 even when there is no refresh command from the exterior of the semiconductor device 300. Since a technology of performing a self-refresh operation in the interior of the semiconductor device 300 is well known in the art, a detailed description thereof will be omitted.

In an embodiment, since the cycle time of the oscillation signal osc outputted from the oscillator 100 maintains a substantially constant value regardless of the process variation, it is possible to substantially prevent an abnormal operation of the semiconductor device due to process variation.

In the case of a DRAM, a leakage current in the memory cell array 10 increases at high temperature and decreases at low temperature. Accordingly, at temperature lower than the reference temperature, the cycle time of the oscillation signal osc may be longer.

However, even in the case of low temperature, in order to substantially prevent data loss due to leakage, it is preferable to design the oscillator such that the cycle time of the oscillation signal osc is equal to or less than a constant upper limit.

Since the oscillator 100 according to an embodiment has a configuration in which the output voltage VS of the current source CS, that is, the second reference voltage V2, can be adjusted by trimming as expressed by Equation 2 above, a cycle time during operation at a low temperature can be designed to approach an upper limit as a maximum.

Through this, a self-refresh cycle is increased in a relatively low temperature section up to a maximum, so that it is possible to substantially prevent the performance deterioration of the semiconductor device 300 and to substantially prevent power waste.

As measured in an experiment, an oscillator included in a conventional semiconductor memory device produced an oscillation signal having a cycle time of 3.6 µs at 95° C. and a cycle time of 40 µs at 25° C. However, the oscillator 100 according to an embodiment produced an oscillation signal having a cycle time of 4 µs at 90° C. and a cycle time of 57 µs at 25° C.

As described above, the cycle time of the oscillation signal of the embodiment at 25° C. is longer, so that the number of times a refresh of the semiconductor device is performed is reduced, resulting in a reduction of power consumption.

While certain embodiments have been described above, it will be understood to those skilled in the art that the embodiments described are by way of example only. Accordingly, the oscillator and the semiconductor device including the same described herein should not be limited based on the described embodiments. Rather, the oscillator and the semiconductor device including the same described herein should only be limited in light of the claims that follow when taken in conjunction with the above description and accompanying drawings.

What is claimed is:

1. An oscillator comprising:
   a flip-flop that outputs a first signal having a phase that is inverted according to a comparison signal;
   a comparison circuit that compares an amplification voltage with a first reference voltage and outputs the comparison signal;
   a current source providing an output voltage that is fixed to a second reference voltage;
   an amplification circuit that generates the amplification voltage according to a current outputted from the current source and the second reference voltage; and
   a reference voltage generation circuit that outputs the first reference voltage and the second reference voltage according to a trimming code.

2. The oscillator according to claim 1, wherein the second reference voltage is adjusted according to a process variation of the current source.

3. The oscillator according to claim 1, wherein the reference voltage generation circuit comprises:
   a voltage division circuit that divides a power supply voltage using a plurality of resistors and outputs a plurality of divided voltages;
   a first selector that selects one of the plurality of divided voltages according to the trimming code and outputs a selected voltage as the first reference voltage; and
   a second selector that selects one of the plurality of divided voltages according to the trimming code and outputs a selected voltage as the second reference voltage.

4. The oscillator according to claim 3, wherein the reference voltage generation circuit further comprises:
   a decoder that decodes the trimming code and provides a decoded trimming code to the first selector and the second selector.

5. The oscillator according to claim 1, wherein the comparison circuit outputs the comparison signal that is activated when the amplification voltage exceeds the first reference voltage, and is deactivated when the amplification voltage is smaller than the first reference voltage.

6. The oscillator according to claim 5, wherein the comparison circuit has a first input terminal and a second input terminal to which the amplification voltage or the first reference voltage is selectively inputted according to the first signal.

7. The oscillator according to claim 6, further comprising:
a $1\text{-}1^{th}$ switch that applies the first reference voltage to the first input terminal when the first signal is activated;
a $2\text{-}1^{th}$ switch that applies the amplification voltage to the second input terminal when the first signal is activated;
a $1\text{-}2^{th}$ switch that applies the first reference voltage to the second input terminal when the first signal is deactivated; and
a $2\text{-}2^{th}$ switch that applies the amplification voltage to the first input terminal when the first signal is deactivated.

8. The oscillator according to claim 1, wherein the amplification circuit comprises:
an operational amplifier having a first input terminal and a second input terminal to which an output of the current source and the second reference voltage are selectively applied, and an output terminal that outputs the amplification voltage;
a first charging circuit that is connected to an output node of the current source and the output terminal when the first signal is activated, and generates the amplification voltage; and
a second charging circuit that is connected to the output node of the current source and the output terminal when the first signal is deactivated, and generates the amplification voltage.

9. The oscillator according to claim 8, wherein the amplification circuit discharges the second charging circuit when the first signal is activated, and discharges the first charging circuit when the first signal is deactivated.

10. The oscillator according to claim 9, further comprising:
a $3\text{-}1^{th}$ switch that connects the first charging circuit to the output terminal of the amplification circuit when the first signal is activated;
a $4\text{-}1^{th}$ switch that discharges the second charging circuit when the first signal is activated;
a $5\text{-}1^{th}$ switch that applies the second reference voltage to the first input terminal of the amplification circuit when the first signal is activated;
a $6\text{-}1^{th}$ switch that applies the output voltage of the current source to the second input terminal of the amplification circuit when the first signal is activated;
a $3\text{-}2^{th}$ switch that connects the second charging circuit to the output terminal of the amplification circuit when the first signal is deactivated;
a $4\text{-}2^{th}$ switch that discharges the first charging circuit when the first signal is deactivated;
a $5\text{-}2^{th}$ switch that applies the second reference voltage to the second input terminal of the amplification circuit when the first signal is deactivated; and
a $6\text{-}2^{th}$ switch that applies the output voltage of the current source to the first input terminal of the amplification circuit when the first signal is deactivated.

11. A semiconductor device comprising:
an oscillator that outputs an oscillation signal;
a memory cell array; and
a self-refresh controller that controls a self-refresh operation of the memory cell array according to the oscillation signal,
wherein the oscillator comprises:
a flip-flop that outputs the oscillation signal having a phase that is inverted according to a comparison signal;
a comparison circuit that compares an amplification voltage with a first reference voltage and outputs the comparison signal;
a current source providing an output voltage that is fixed to a second reference voltage;
an amplification circuit that generates the amplification voltage according to a current outputted from the current source and the second reference voltage; and
a reference voltage generation circuit that outputs the first reference voltage and the second reference voltage according to a trimming code.

12. The semiconductor device according to claim 11, wherein the second reference voltage is adjusted according to a process variation of the current source.

13. The semiconductor device according to claim 11, wherein the reference voltage generation circuit comprises:
a voltage division circuit that divides a power supply voltage using a plurality of resistors and outputs a plurality of divided voltages;
a first selector that selects one of the plurality of divided voltages according to the trimming code and outputs a selected voltage as the first reference voltage; and
a second selector that selects one of the plurality of divided voltages according to the trimming code and outputs a selected voltage as the second reference voltage.

14. The semiconductor device according to claim 11, wherein the comparison circuit outputs the comparison signal that is activated when the amplification voltage exceeds the first reference voltage, and is deactivated when the amplification voltage is smaller than the first reference voltage.

15. The oscillator according to claim 11, wherein the amplification circuit comprises:
an operational amplifier having a first input terminal and a second input terminal to which an output of the current source and the second reference voltage are selectively applied, and an output terminal that outputs the amplification voltage;
a first charging circuit that is connected to an output node of the current source and the output terminal when a first signal is activated, and generates the amplification voltage; and
a second charging circuit that is connected to the output node of the current source and the output terminal when the first signal is deactivated, and generates the amplification voltage.

* * * * *